United States Patent
Rhodes

(10) Patent No.: US 8,003,506 B2
(45) Date of Patent: *Aug. 23, 2011

(54) SINGLE POLY CMOS IMAGER

(75) Inventor: Howard E. Rhodes, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 1 day.

This patent is subject to a terminal disclaimer.

(21) Appl. No.: 12/492,765

(22) Filed: Jun. 26, 2009

(65) Prior Publication Data

US 2009/0298272 A1    Dec. 3, 2009

Related U.S. Application Data

(60) Continuation of application No. 11/022,697, filed on Dec. 28, 2004, now Pat. No. 7,557,024, which is a division of application No. 10/688,974, filed on Oct. 21, 2003, now Pat. No. 6,998,657.

(51) Int. Cl.
*H01L 21/3205* (2006.01)

(52) U.S. Cl. .............. 438/587; 438/60; 438/73; 438/74; 438/75; 438/76; 438/77; 438/78; 438/79; 438/144; 438/279; 438/585; 438/595

(58) Field of Classification Search .................... 438/60, 438/73–79, 144, 279, 585, 587, 595
See application file for complete search history.

(56) References Cited

U.S. PATENT DOCUMENTS

| | | | |
|---|---|---|---|
| 5,296,410 A | 3/1994 | Yang | |
| 5,310,693 A | 5/1994 | Hsue | |
| 5,471,515 A | 11/1995 | Fossum et al. | |
| 5,576,763 A | 11/1996 | Ackland et al. | |
| 5,841,159 A | 11/1998 | Lee et al. | |
| 5,946,566 A | 8/1999 | Choi | |
| 5,981,363 A | 11/1999 | Gardner et al. | |
| 6,103,611 A | 8/2000 | En et al. | |
| 6,204,524 B1 | 3/2001 | Rhodes | |
| 6,333,205 B1 | 12/2001 | Rhodes | |
| 6,376,868 B1 | 4/2002 | Rhodes | |
| 6,613,621 B2 | 9/2003 | Uh et al. | |
| 6,723,623 B1 * | 4/2004 | Nguyen | 438/525 |
| 6,794,313 B1 * | 9/2004 | Chang | 438/770 |
| 6,828,634 B2 | 12/2004 | Oshima | |
| 6,995,437 B1 | 2/2006 | Kinoshita et al. | |
| 7,557,024 B2 * | 7/2009 | Rhodes | 438/587 |
| 2001/0015454 A1 | 8/2001 | Lee et al. | |
| 2003/0216004 A1 | 11/2003 | Jeong et al. | |
| 2005/0042879 A1 * | 2/2005 | Yin et al. | 438/696 |

* cited by examiner

*Primary Examiner* — Kevin M Picardat
*Assistant Examiner* — Bac H Au
(74) *Attorney, Agent, or Firm* — Lerner, David, Littenberg, Krumholz & Mentlik, LLP

(57) ABSTRACT

More complete charge transfer is achieved in a CMOS or CCD imager by reducing the spacing in the gaps between gates in each pixel cell, and/or by providing a lightly doped region between adjacent gates in each pixel cell, and particularly at least between the charge collecting gate and the gate downstream to the charge collecting gate. To reduce the gaps between gates, an insulator cap with spacers on its sidewalls is formed for each gate over a conductive layer. The gates are then etched from the conductive layer using the insulator caps and spacers as hard masks, enabling the gates to be formed significantly closer together than previously possible, which, in turn increases charge transfer efficiency. By providing a lightly doped region on between adjacent gates, a more complete charge transfer is effected from the charge collecting gate.

12 Claims, 9 Drawing Sheets

SINGLE POLY CMOS IMAGER

CROSS-REFERENCE TO RELATED APPLICATIONS

This application is a continuation of U.S. application Ser. No. 11/022,697, filed Dec. 28, 2004, now U.S. Pat. No. 7,557,024 which is divisional of U.S. patent application Ser. No. 10/688,974, which was filed Oct. 21, 2003, now U.S. Pat. No. 6,998,657 the disclosures of which are hereby incorporated herein by reference in their entirety.

FIELD OF THE INVENTION

The invention relates generally to semiconductor imaging devices, in particular to silicon imaging devices which can be fabricated using standard CMOS processes, or alternatively, CCD fabrication processes. Particularly, the invention relates to CMOS and CCD imagers and a method of fabricating a CMOS and CCD imagers with improved charge transfer between gates, and furthermore with reduced image lag in CMOS imagers.

BACKGROUND OF THE INVENTION

There are a number of different types of semiconductor-based imagers, including charge coupled devices (CCDs), complementary metal oxide semiconductor devices (CMOS), photodiode arrays, charge injection devices and hybrid focal plane arrays. Among these, CCDs and CMOS imagers are the most commonly used in digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television. Each type of imaging device has advantages and disadvantages relative to the other.

CCDs imagers have a greater sensitivity to light and have better dynamic range than CMOS imagers, and therefore yield superior quality images. CCDs are also capable of large formats with small pixel size, and produces less noise (visual artifacts). As a result of these advantages, CCDs are the preferred technology for high end imaging applications.

However, CCD imagers also suffer from a number of disadvantages. For example, they are susceptible to radiation damage, exhibit destructive read out over time, require good light shielding to avoid image smear, and have a high power dissipation for large arrays. Additionally, while offering high performance, CCD arrays are difficult to integrate with CMOS processing due in part to a different processing technology and to their high capacitances, which complicates the integration of on-chip drive and signal processing electronics with the CCD array. Further in this regard, CCDs must be manufactured at one of a small number of specialized fabrication facilities, thus greatly increasing production costs and limiting economies of scale. CCDs also must transfer an image by line charge transfers from pixel to pixel, requiring that the entire array be read out into a memory before individual pixels or groups of pixels can be accessed and processed. CCDs may also suffer from incomplete charge transfer from pixel to pixel during charge transfer, which results in image smear.

On the other hand, CMOS imagers have the advantage of being compatible with integrated on-chip electronics (control logic and timing, image processing, and signal conditioning such as A/D conversion). On-chip integration of electronics provides the potential to perform many signal conditioning functions in the digital domain (versus analog signal processing) as well as to achieve a compact system size. CMOS imagers also allow random access to the image data, and have low fabrication costs as compared with CCD imagers since standard CMOS processing techniques can be used. Additionally, CMOS imagers have low voltage operation and low power consumption because only one row of pixels at a time needs to be active during readout and there is no charge transfer (and associated switching) from pixel to pixel during image acquisition.

Both CCD and CMOS imagers perform the necessary functions of (1) photon to charge conversion; (2) accumulation of image charge; (3) transfer of the accumulated image charge; (4) converting the accumulated image charge to a voltage; and (5) output and amplification of the signal voltage representing the charge from each pixel in the imager. Both CCD and CMOS imagers include an array of pixels, each pixel having a substrate and a photosensitive area formed in or on the substrate and which converts photons from the incident light into charge, either electrons or holes. CCD and CMOS imagers differ, however, in their structure and manner of processing accumulated charges after photon to charge conversion.

The basic structure of a pixel within a CCD imager is shown in FIG. 1 and includes a silicon substrate 10, a thin film of insulating material 11 such as silicon dioxide overlying the substrate surface, and a plurality of gate electrodes 12a formed of a conductive material, such as doped polysilicon, formed spaced apart from each other on top of the layer of insulating material 11. As shown in FIG. 1, additional gate electrodes 12b are formed between and overlapping electrodes 12a. Gate electrodes 12b may also be formed of doped polysilicon. An insulator layer 9 is formed over the surface of electrodes 12a prior to forming the overlapping electrodes 12b to prevent shorting between electrodes 12a and 12b.

Substrate 10 includes a buried channel 8 formed in the substrate 10 under the electrodes 12a, 12b. Typically in a CCD imager, the substrate is doped p-type, whereupon the buried channel is doped n-type. When a voltage is applied to gate electrode 12b, for example, photons from the incident light are converted to electrical charge in the buried channel 8 under the "activated" gate 12b, and a well 13 is formed in the substrate in which the charge is accumulated under the activated gate 12b. Charge is contained in the well by applying appropriate voltages to the gate electrodes 12a surrounding the activated gate to form zones of higher potential surrounding the well 13, thus confining the accumulated charge in the well 13.

The accumulated charge is transferred out of the pixel by "moving" the well from one gate electrode 12 to another in the pixel by alternating the voltages applied to the different electrodes until the charge is moved out of the pixel. In this manner, the pixel charges are moved through the array 15 row by row (FIG. 2). Movement of charge through each pixel and the array is controlled by a clock signal PCLK inputted to each pixel in the array. When the charges reach the last row 17 in the array 15, the charges are moved horizontally through the row according to the serial clock signal SCLK. After each charge moves through the last pixel position in the last row 17 of the array 15, the charge is passed through an output amplifier 21 to produce an analog voltage representing the amount of charge, and then is outputted from the pixel array 15. Once each pixel signal exits the pixel array, the analog voltage signal is converted to a digital signal in analog-to-digital converter 23. From there, the digital pixel signal is passed to the image processor 25 for compiling the pixel signals into a digital image.

Depending on the number of gates in each pixel within a particular CCD architecture, a complete charge transfer cycle may be completed for each pixel in four phases, three phases or two phases, in accordance with the clock signal PCLK. For example, a timing diagram for a four phase CCD is shown in FIG. 3. In this pixel, integration time occurs at t1 when the voltage on the Φ1 and Φ2 gates are held at a high level to form low potential zones while the voltages of the Φ3 and Φ4 gates are held at a low level to form high potential barriers. During this time, photo-induced charge is collected in a potential well which is formed under the Φ1 and Φ2 gates. The well is then moved under the Φ2 and Φ3 gates by applying a high voltage to the Φ2 and Φ3 gates and a low voltage to the Φ1 and Φ4 gates at time t2. At time t3, the well is similarly moved under the Φ3 and Φ4 gates, and eventually under the Φ1 and Φ2 gates of the next pixel. In this manner, all the collected charge in the pixel array during one integration period is moved through the array until outputted to output amplifier 21.

An exemplary CMOS imager is described below with reference to FIG. 4. The circuit described below, for example, includes a photogate for accumulating photo-generated charge in an underlying portion of the substrate. However, it should be understood that the photosensitive element of a CMOS imager pixel may alternatively be formed as a depleted p-n junction photodiode, a photoconductor, or other image-to-charge converting device, in lieu of a field induced depletion region beneath a photogate. It is noted that photodiodes may experience the disadvantage of image lag, which can be eliminated if the photodiode is completely depleted upon readout.

Like a CCD imager, the CMOS imager includes a focal plane array of pixel cells. As shown in FIG. 4, a simplified circuit for a pixel of an exemplary CMOS imager includes a pixel photodetector circuit 14 and a readout circuit 60. It should be understood that while FIG. 4 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 formed typically of a p-type silicon, and having a surface well of p-type material 20. An optional layer 18 of p-type material may be used if desired, but is not required. Substrate 16 may be formed of, for example, Si, SiGe, Ge, and GaAs. Typically the entire substrate 16 is a p-type doped silicon substrate and may contain a surface p-well 20 (with layer 18 omitted), but many other options are possible, such as, for example p on p– substrates, p on p+ substrates, p-wells in n-type substrates, or the like.

An insulating layer 22 of silicon dioxide, silicon nitride or other suitable material is formed on the upper surface of p-well 20. A photogate 24 thin enough to pass radiant energy or of a material which passes radiant energy is formed on the insulating layer 22. The photogate 24 receives an applied control signal PG which causes the initial accumulation of pixel charges underneath the photogate 24 and in n+ region 26. The n+ type region 26, adjacent one side of photogate 24, is formed in the upper surface of p-well 20.

A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. When a transfer signal TX is applied to the transfer gate 28, the charge accumulated in n+ region 26 is transferred into n+ region 30. The n+ region 30 is typically called a floating diffusion node, and is also a node for passing charge accumulated thereat to the gate of a source follower transistor 36 described below.

A reset gate 32 is also formed on insulating layer 22 adjacent and between n+ type node 30 and another n+ region 34 which is also formed in p-well 20. The reset gate 32 and n+ regions 30 and 34 form a reset transistor 31 which is controlled by a reset signal RST. The n+ type region 34 is coupled to voltage source VDD. The transfer and reset transistors 29, 31 are n-channel transistors as described in this implementation of a CMOS imager circuit in a p-well. It should be understood that it is possible to implement a CMOS imager in an n-well, in which case each of the transistors would be p-channel transistors. It should also be noted that while FIG. 4 shows the use of a transfer gate 28 and associated transistor 29, this structure provides advantages, but is not required.

Photodetector circuit 14 also includes two additional n-channel transistors, source follower transistor 36 and row select transistor 38. Transistors 36 and 38 are coupled in series, source to drain, with the source of transistor 36 also coupled over lead 40 to voltage source VDD and the drain of transistor 38 coupled to a lead 42. The gate of transistor 36 is coupled over lead 44 to n+ region 30. Charge from the floating diffusion node at the n+ region 30 is typically converted to a pixel output voltage by the source follower output transistor 36. The drain of row select transistor 38 is connected via conductor 42 to the drains of similar row select transistors for other pixels in a given pixel row. A load transistor 39 is also coupled between the drain of transistor 38 and a voltage source VSS. Transistor 39 is kept on by a signal VLN applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage VSS. The upper side of the capacitor 64 is also connected to the gate of a p-channel output transistor 66. The drain of the output transistor 66 is connected through a column select transistor 68 to a signal sample output node VOUTS and through a load transistor 70 to the voltage supply VDD. A sample and hold signal (SHS) briefly turns on the S/H transistor 62 after the charge accumulated beneath the photogate electrode 24 has been transferred to the floating diffusion node 30, and from there, to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The bottom side of the capacitor 74 is connected to the source voltage VSS. The upper side of the capacitor 74 is also connected to the gate of a p-channel output transistor 76. The drain of the output transistor 76 is connected through a p-channel column select transistor 78 to a reset sample output node VOUTR and through a load transistor 80 to the supply voltage VDD. A sample and hold reset signal (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages VOUTR and VOUTS of the readout circuit 60. These voltages are then subtracted (VOUTS–VOUTR) by subtractor 82 to provide an output signal terminal 81 which is an image signal independent of pixel to pixel variations caused by fabrication variations in the reset voltage transistor 31 which might cause pixel to pixel variations in the output signal.

FIG. 5 illustrates a block diagram for a CMOS imager having a pixel array 90 with each pixel cell being constructed in the manner shown by element 14 of FIG. 4. While pixel array 90 comprises a plurality of pixels arranged in a predetermined number of columns and rows, FIG. 6 shows a 2×2 portion of pixel array 90 for illustrative purposes in this discussion. The pixels of each row in array 90 are and turned on at the same time by a row select line, e.g., line 86, and the pixels of each column are selectively output by a column select line, e.g., line 42. A plurality of rows and column lines are provided for the entire array 90. The row lines are selectively activated by the row driver 92 in response to row address decoder 94 and the column select lines are selectively activated by the column driver 96 in response to column address decoder 98. Thus, a row and column address is provided for each pixel. The CMOS imager is operated by the control circuit 95 which controls address decoders 94, 98 for selecting the appropriate row and column lines for pixel readout, and row and column driver circuitry 92, 96 which apply driving voltage to the drive transistors of the selected row and column lines.

FIG. 7 shows a simplified timing diagram for the signals used to transfer charge out of photodetector circuit 14 of the FIG. 4 CMOS imager. The photogate signal PG is nominally set to 5V and the reset signal RST is nominally set at 2.5V. As can be seen from the figure, the process is begun at time $t_0$ by briefly pulsing reset voltage RST to 5V. The RST voltage, which is applied to the gate 32 of reset transistor 31, causes transistor 31 to turn on and the floating diffusion node 30 to charge to the VDD voltage present at n+ region 34 (less the voltage drop Vth of transistor 31). This resets the floating diffusion node 30 to a predetermined voltage (VDD-Vth). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72, which charges capacitor 74 with the source follower transistor output voltage on line 42 representing the reset charge present at floating diffusion node 30. The PG signal is next pulsed to 0 volts, causing charge to be collected in n+ region 26.

A transfer gate voltage pulse TX, similar to the reset pulse RST, is then applied to transfer gate 28 of transistor 29 to cause the charge in n+ region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 with signal SHS. The column select signal is next applied to transistors 68 and 70 and the respective charges stored in capacitors 64 and 74 are subtracted in subtractor 82 to provide a pixel output signal at terminal 81. It should also be understood that CMOS imagers may dispense with the transistor gate 28 and associated transistor 29, or retain these structures while biasing the transfer transistor gate 28 to an always "on" state.

Both CMOS and CCD imagers are susceptible to inefficient charge transfer between gates. In the CMOS imager shown in FIG. 4, the presence of an n+ region 26 is necessary to electrically couple the photogate 24 to the transfer gate 28 across the relatively wide gap, e.g., 0.25 microns, separating the transfer gate 28 and the photogate 24. When a signal TX is applied to the transfer gate 28, the n+ region 26 functions as a conducting channel to pass charges from the doped layer under the photogate into the channel region of the transfer transistor 29, and then to the floating diffusion node 30. Incorporation of the n+ region 26, however, produces excess noise and incomplete charge transfer between gates. Similarly, in CCD imagers, it is known that the transfer of charge from gate to gate and pixel to pixel is never 100% efficient.

In order to improve the charge transfer between gates in both CMOS and CCD imagers, the gates must be spaced as close together as possible. The gates are formed by depositing a single layer of polysilicon (or other suitable conductive material) on the substrate surface (over the insulating layer such as silicon dioxide, silicon nitride, etc.). The individual gates are then patterned from the blanket deposited layer by applying a layer of photoresist over the polysilicon (or other conductive) material, and exposing the photoresist through a reticle to develop the portions of the photoresist where the gates are to be formed. The undeveloped portions of the photoresist are then removed. Once the shaped photoresist layer has been obtained on the blanket deposited layer of conductive material, the gates are shaped by etching the layer of conductive material around the patterned photoresist layer.

The smallest distance between semiconductor structures using known patterning methods such as that mentioned above is subject to the physical limitations of how thin a distinguishable line or gap can be formed in the photoresist layer by patterning with the reticle. Recent advances in technology enable lines and spaces between semiconductor structures to be 0.13 micrometers apart, i.e., about 1300 Angstroms. Even with these measurements, however, the resulting gaps between polysilicon gates still yield incomplete charge transfer.

BRIEF SUMMARY OF THE INVENTION

The present invention addresses the problem of incomplete and inefficient charge transfer between gates formed on a semiconductor substrate in a CMOS or CCD imager. In particular, the present invention provides a method of fabricating a plurality of single layer gates on a CMOS or CCD imager which significantly reduces the gaps between gates, to thereby reduce or eliminate the problem of incomplete charge transfer.

The method includes blanket depositing the conductive material from which the gates will ultimately be formed, as is standard practice in the art, and then blanket depositing a layer of insulator material, such as an oxide or nitride material, and patterning the insulator material in a manner similar to that in which the conductive layers are patterned in the prior art to form the CMOS or CCD pixel gates. The patterned insulator structures are referred to as "caps." Next, spacers are deposited on the sides of the patterned insulator material to decrease the width of the gaps between caps. Using the spacer-reduced gaps between the insulator caps on top of the conductive layer, the conductive layer is etched, resulting in gate structures which are approximately 300 Angstroms apart.

A variation of this method includes blanket depositing a layer of the conductive material from which the gates are to be formed, and then depositing a layer of resist over the conductive material layer. The resist is patterned according to the desired gate arrangement, and the conductive layer is partially etched to form gate-like structures of the conductive material protruding above the remaining thickness of the conductive material layer. Next, spacers are formed along the sidewalls of the gate-like structures, and the remaining thickness of the conductive layer around the gate-like structures is etched away. During this second etch process, the portion of the conductive material between the spacers is also etched, leaving the resulting gate structures which spaced apart by approximately the distance between the spacers formed on the sidewalls of adjacent gates.

A second aspect of the present invention may be used during the fabrication of CMOS imagers either separately or in conjunction with the method briefly described above, and includes providing a lightly doped region n− between the photogate and an adjacent gate, instead of standard heavily doped region n+.

Additional advantages and features of the present invention will be apparent from the following detailed description and drawings which illustrate preferred embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" used in the description includes any semiconductor-based structure having an exposed surface on which to form the circuit structure used in the invention. "Wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions and/or junctions in the base semiconductor structure or foundation. In addition, the semiconductor need not be silicon-based, but may be based on silicon-germanium, germanium, or gallium arsenide.

Figure 8:
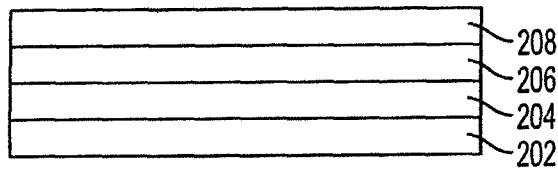
FIG. 8 illustrates an interim stage of a standard process for fabricating a CCD or CMOS imager.
Figure 9:
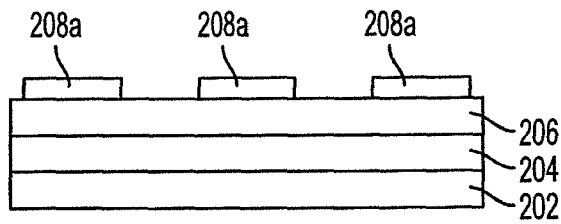
FIG. 9 illustrates a processing stage subsequent to that shown in FIG. 8.

To provide a foundation for understanding the present invention, an example of a prior art process for forming the transistor gates for an image sensor is described below with reference to FIGS. 8-10. As seen in FIG. 8, a substrate 202 is doped to a first conductivity type, which for exemplary purposes will be described as p-type. An insulating layer 204 is formed over the doped substrate 202 by thermal growth or chemical vapor deposition, or other means. The insulating layer 204 may be silicon dioxide, silicon nitride, or other suitable insulating material. Next, a conductive layer 206 such as a doped polysilicon layer is deposited over the insulating layer 204. To impart conductivity to the polysilicon layer 206, the layer is doped either in situ or by subsequent implantation with a dopant after deposition.

A layer of photoresist 208 is then applied over the conductive layer 206, and the photoresist is developed by exposure to a light through a reticle to produce the desired pattern of the transistor gates. Upon removal of the undeveloped portions of the photoresist, the developed photoresist portions 208a remain on the conductive layer 206, as shown in FIG. 9.

Individual transistor gates 206a are then formed by etching the conductive layer 206 through to the insulating layer 204. Conductive layer 206 may be directionally etched by a suitable process such as reactive ion etching, or any other method readily known in the art, including immersion or spray-type wet etching, and plasma, or ion milling. Subsequent to the formation of the transistor gates 206a, the patterned photoresist is then removed by wet etch or dry etch methods such as exposing the wafer to an oxygen-containing plasma, to obtain the structure shown in FIG. 10.

Figure 10:
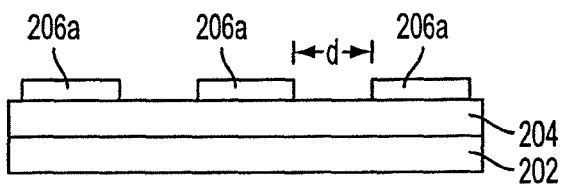
FIG. 10 illustrates a processing stage subsequent to that shown in FIG. 9.

The distance between transistor gates 206a is denoted in FIG. 10 by the reference symbol "d." The minimum distance "d" is determined by the patterned photoresist which defines the regions in the layers underneath to be exposed or unexposed. Since the photoresist is patterned by shining light through a reticle, the minimum thickness of a line in the pattern is subject to the physical limitations of how thin a line can be formed in the reticle. In the prior art process described above, the minimum achievable distance "d" is 1300 Angstroms, which still results in incomplete charge transfer between gates in both CCD and CMOS image sensors.

Figure 11:
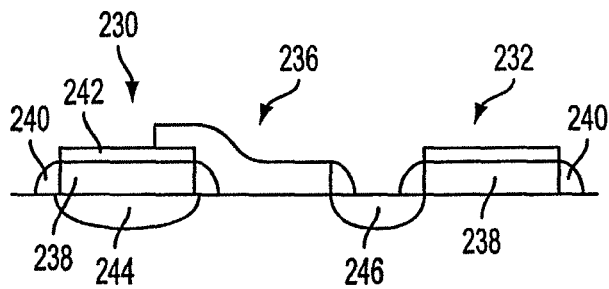
FIG. 11 illustrates a first example of an overlapping gate structure.

To address the problem of incomplete charge transfer, the transistor gates may be formed as double polysilicon structures, such as that shown in FIG. 11. In the double polysilicon CMOS imager shown in FIG. 11, a photogate 230 and a reset gate 232 are formed using the same layer of polysilicon 238 (or other conductive material). After formation of spacers 240, the top surfaces of all polysilicon gates are then oxidized to form an oxide insulation layer 242, and then a transfer gate 236 is formed from a second layer of polysilicon that overlaps the photogate 230 to some degree. The oxide layer 242 electrically insulates the photogate 230 and the overlapping transfer gate 236.

Figure 12:
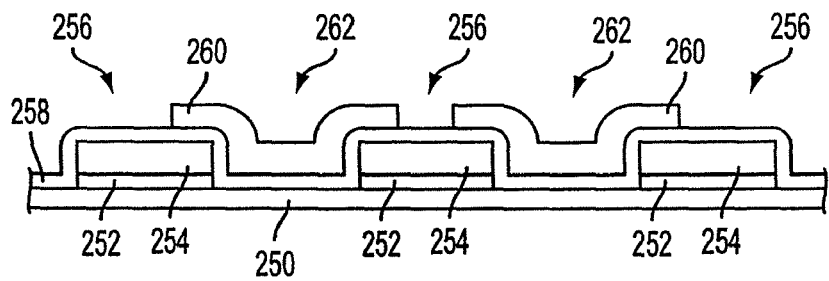
FIG. 12 illustrates a second example of an overlapping gate structure.

FIG. 12 facilitates explanation of an alternative process for fabricating a double polysilicon structure. In this process, after depositing a first gate oxide layer 252 and a first polysilicon layer 254 on a substrate 250 and formation of the gates 256 from the first polysilicon layer, the portions of the gate oxide layer not covered by the polysilicon gates 256 are stripped away using any suitable means, whereupon a second oxide layer 258 is grown over the existing landscape before depositing the second polysilicon layer 260 and patterning the overlapping gates 262 therefrom. The second oxide layer eliminates the need to form spacers on the gates formed from the first polysilicon layer, and to separately oxidize the gates.

Referring back to FIG. 11, since there is no need to couple the photogate 230 and the transfer gate 236 with a doped region between the gates to enable charge transfer, this more compact structure results in increased charge transfer efficiency of the accumulated charges generated by photogate 230 to the floating diffusion node 246. However, there are significant processing difficulties in the fabrication methods used to create this semiconductor structure. The oxidation of the photogate stack 230 prior to transfer gate stack 236 formation results in asperities, points, and other defects in the oxide layer insulating the transfer gate from the photogate, resulting in low breakdown of the insulating gate oxide between these two overlying gate structures, improper electrical functioning, and poor processing yield. Additionally, the oxidation of the first polysilicon layer (or other suitable conductive layer), prior to the deposition of the second polysilicon (or other suitable conductive material) layer which will form the transfer gate 236, forms the second gate oxide under the transfer gate. As device configurations have shrunk to improve performance and yield, the gate oxide must be grown thinner to maintain low threshold voltages and maintain performance in the more compact configurations. The thinning of the second gate oxide continues to cause degradation in the breakdown voltage between these two overlapping gate structures.

Although no doped region is required to couple the photogate 230 with the transfer gate 236, a doped region 244 may be formed under the photogate 230 to provide a well in which charges generated at photogate 230 can accumulate until transferred to the floating diffusion region 246. The double polysilicon structure therefore requires careful alignment when performing the implanting of the doped region 244 to ensure that the doped region 244 does not extend across the area to be occupied by transfer gate 236 in a later processing step.

This double polysilicon process also suffers from the fact that all transistors formed by the first polysilicon deposition, including the photogate 230 and the reset gate 232, cannot be silicided gates, which would improve circuit speed and performance, for at least two reasons: (1) the top silicide layer cannot be oxidized to provide a reliable insulating oxide between the photogate 230 and the transfer gate 236, and (2) a silicide layer on top of the photogate would block signal light from passing through the photogate into the signal storage region 244 below the photogate.

The invention discussed below also addresses the problem of incomplete charge transfer but without any of the disadvantages discussed heretofore. FIGS. 13-17 illustrate a process for forming transistor gates on a semiconductor substrate for either a CCD imager or a CMOS imager in accordance with a first aspect of the present invention, while FIG. 18 shows a semiconductor device formed according to a second aspect of the invention.

Figure 13:
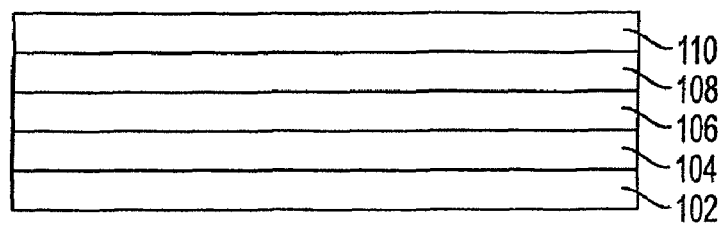
FIG. 13 illustrates an interim stage of processing for fabricating a semiconductor device according to a first aspect of the present invention.

As shown in FIG. 13, an insulating layer 104, preferably made of an oxide material, is formed over a substrate 102, and a conductive layer 106, preferably a doped polysilicon layer or other transparent conductor, is formed over the insulating layer 104. The conductive layer 106 may also suitably be formed as a silicide layer, a metal layer, a polysilicon/silicide layer, or a polysilicon/metal layer. Substrate 102 is preferably doped to a first conductivity type, preferably p-type. Insulating layer 104 may be any suitable oxide, nitride, oxide nitride, nitride oxide, or metal oxide material, such as silicon oxide, silicon nitride, or silicon oxynitride, for example, and is formed over the substrate 102 by thermal growth or chemical vapor deposition, or other means to a thickness of in the range of approximately 2 to 100 nm. Conductive layer 106 may be formed to any suitable thickness, e.g., in the range of approximately 200 to 5000 Angstroms.

Thus far, the process is similar to the prior art process illustrated in FIG. 8 and discussed above. Instead of forming the transistor gates directly by applying a resist layer and developing the resist layer, however, the present invention next deposits an additional layer of an insulator material 108 over the conductive layer 106. As with the insulator layer 104, insulator layer 108 may be formed of an oxide or nitride material or other suitable insulator material.

Figure 14:
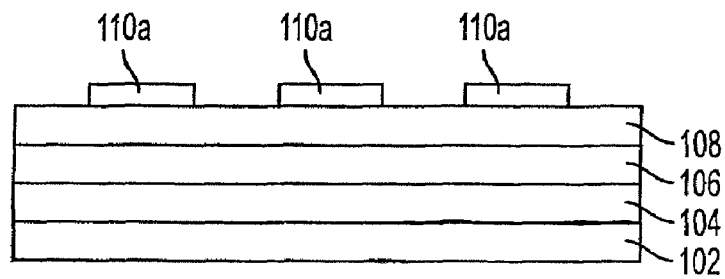
FIG. 14 illustrates a processing stage of the present invention subsequent to that shown in FIG. 13.

Next, a resist layer 110 is deposited on the insulator layer 108 and then patterned, whereby the undeveloped resist is removed to leave behind developed portions 110a, as shown in FIG. 14.

Figure 15:
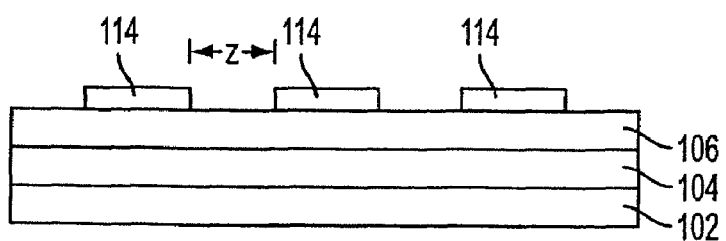
FIG. 15 illustrates a processing stage of the present invention subsequent to that shown in FIG. 14.

Exposed portions of the insulator layer 108 are then etched away using a directional etch method such as reactive ion etching, or other suitable removal process such as immersion or spray-type wet etching, and plasma or ion milling, and the remaining resist portions 110a are removed by wet or dry etch methods to thereby form insulator caps 114 on the surface of conductive layer 106, as seen in FIG. 15. As with the prior art, insulator caps 114 are spaced approximately 1300 Angstroms apart.

Figure 16:
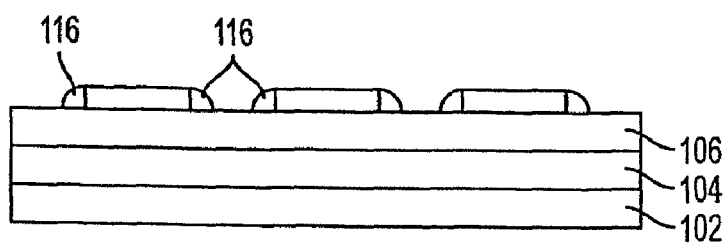
FIG. 16 illustrates a processing stage of the present invention subsequent to that shown in FIG. 15.

Referring now to FIG. 16, after formation of the insulator caps 114, spacers 116 are formed along the sidewalls of the insulator caps 114 by blanket depositing an insulator material, and then etching the deposited material using an anisotropic dry etch that removes the deposited insulator material from the horizontal surfaces of the insulator caps 114 and the polysilicon layer 106. Preferably, the spacers 116 are formed to a thickness of about 500 Angstroms each, and the insulating material used to form the spacers 116 may be any suitable insulator material such as an oxide, nitride, oxide nitride, nitride oxide, or metal oxide.

Figure 17:
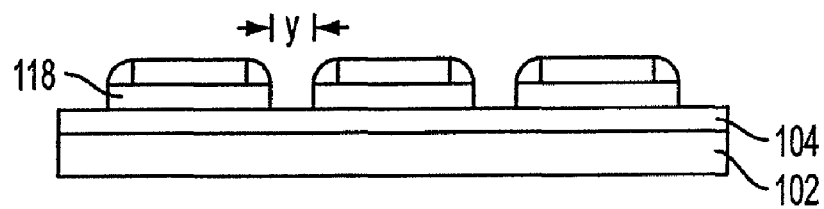
FIG. 17 illustrates a processing stage of the present invention subsequent to that shown in FIG. 16.
Figure 18:
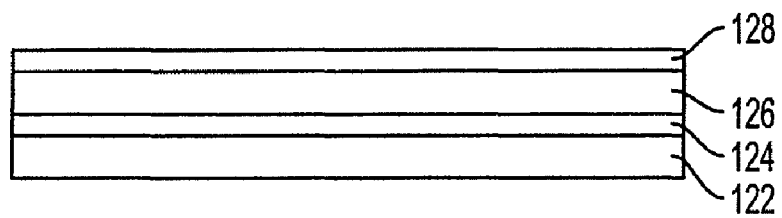
FIG. 18 illustrates a n interim stage of processing for fabricating a semiconductor device according to a variant of the first aspect of the present invention.
Figure 19:
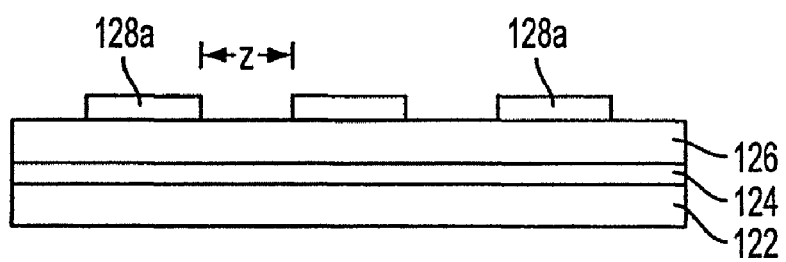
FIG. 19 illustrates a processing stage of the present invention subsequent to that shown in FIG. 18.
Figure 20:
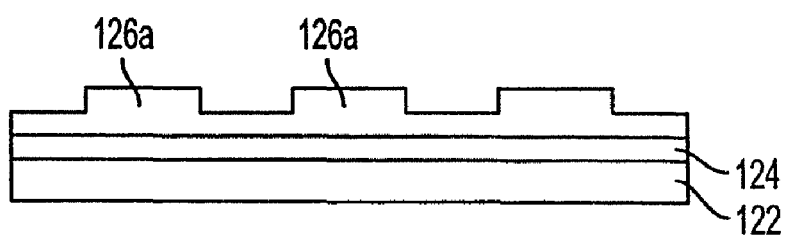
FIG. 20 illustrates a processing stage of the present invention subsequent to that shown in FIG. 19.

After forming the spacers 116 on the sidewalls of the insulator caps 114, another etch process is performed to etch through the conductive layer 106, using the insulator caps 114 and spacers 116 as hard masks, to yield the gate structures 118 as illustrated in FIG. 17.

Using the process of the present invention, the distance between the conductive gate structures 118 is much smaller than previously achieved using a mask and resist alone. In the example described herein, the smallest achievable distance "z" between insulator caps 114 in FIG. 15 is the same as the smallest achievable distance "d" in FIG. 10 between transistor gates 206a in the prior art, as both are defined by the minimum spacing in the mask forming technology. Presently, the minimum distance of "d" and "z" achievable using masks is about 1300 Angstroms. By forming spacers on insulator caps 114, the width of the insulator caps is increased by two times the width of the spacers. If the spacers each have a width of approximately 500 Angstroms, the resulting distance "y" (FIG. 17) between gate structures 118 formed using the insulator caps 114 plus spacers 116 as hard masks is 300 Angstroms.

An alternative method for forming gate structures in accordance with this aspect of the invention is shown in and described with reference to FIGS. 18-22. This method is similar to the method described above and shown in FIGS. 13-17 in that spacers are used to form the gate structures more closely together than can be achieved with masking techniques. As was the case in the process illustrated by FIG. 13, an insulating layer 124 is formed over a substrate 122, and a conductive layer 126 is formed over the insulating layer 124. The insulating layer 124 and conductive layer 126 may be made of any of the materials mentioned above as being suitable for insulating layer 104 and conductive layer 106, and the thickness of the conductive layer 126 is comparable to the thickness of conductive layer 106.

Next, as can be seen in FIG. 18, a resist layer 128 is deposited on the conductive layer 126, instead of forming another insulator layer on the conductive layer and then a resist layer on the second insulator layer as described above. The resist 128 is patterned according to the desired gate arrangement, resulting in resist portions 128a shown in FIG. 19.

The conductive layer 126 is then partially etched, preferably to approximately half the thickness of the originally deposited conductive layer 126 in the regions not covered by the resist portions 128a. The resist is removed, leaving the structure shown in FIG. 20 in which gate-like portions 126a formed of the conductive material protrudes above the surface of the thinned conductive layer 126. Again, the smallest distance which can be formed between the gate-like portions 126a is "z," which corresponds to the final distance between gate structures in the prior art, and the distance between insulator caps 114 shown in FIG. 15 and produced in the method described above.

Figure 21:
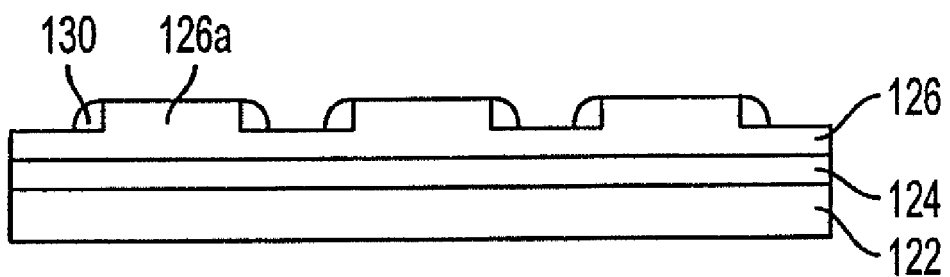
FIG. 21 illustrates a processing stage of the present invention subsequent to that shown in FIG. 20.

Referring now to FIG. 21, spacers 130 are formed along the sidewalls of the gate-like portions 126a in a manner similar to the formation of spacers 116 in FIG. 16. The spacers 130 are made of any suitable insulator material such as those mentioned above with respect to the spacers 116.

After forming the spacers 130, the conductive layer 126 is etched again. This time, the regions thinned in the previous etch process are removed completely, and the thickness of the gate-like portions 126a between the spacers 130 is thinned.

Figure 22:
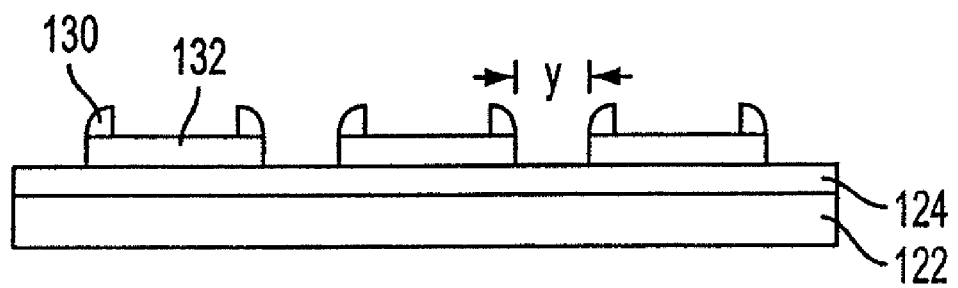
FIG. 22 illustrates a processing stage of the present invention subsequent to that shown in FIG. 21.

As seen in FIG. 22, the width of the resulting gate structures 132 have a width corresponding approximately to the distance from the outside edge of one spacer 130 to the outside edge of the spacer on the opposite side of the respective gate-like portion 126a, with a distance of "y" between adjacent gate structures 132.

In addition to the processes described above with reference to FIGS. 13-17 and 18-22, the present invention also encompasses the all gate structures resulting in whole or in part from the disclosed process of manufacture. The process described above and the resulting structures of the present invention are applicable to both CCD image sensors and CMOS image sensors such as CMOS architectures having 3T, 4T, 5T, 6T and 7T structures, for example. In both CCD and CMOS image sensors, the present invention enables the transistor gates to be formed in a single layer more closely together than previously possible in the prior art, to thereby enhance the efficiency of charge transfer from one gate to the next, and also to decrease the size of image sensors generally to accommodate the trend towards more compact yet more powerful electronic devices.

Figure 4:
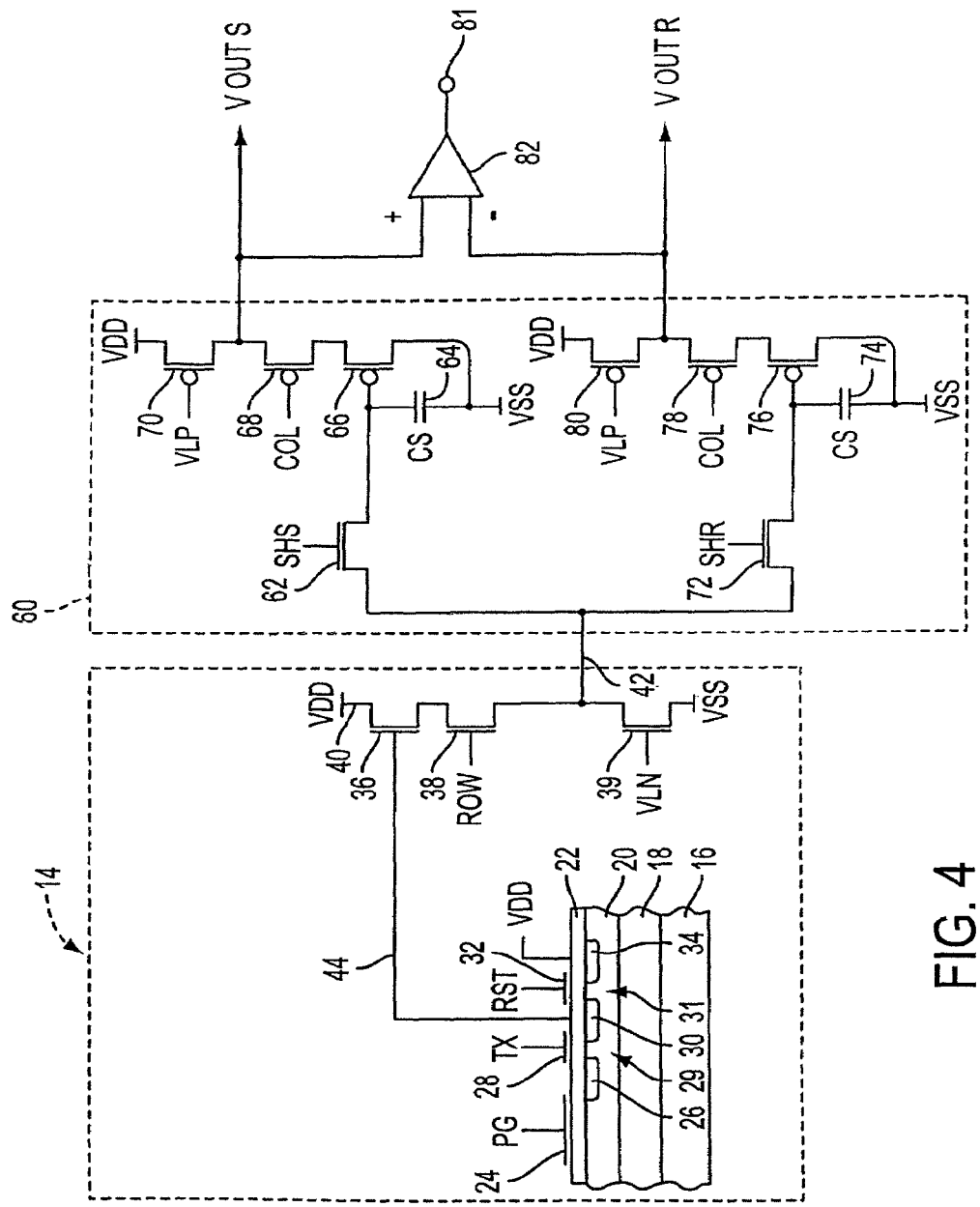
FIG. 4 is an illustrative diagram of a pixel in a CMOS imager circuit.
Figure 6:
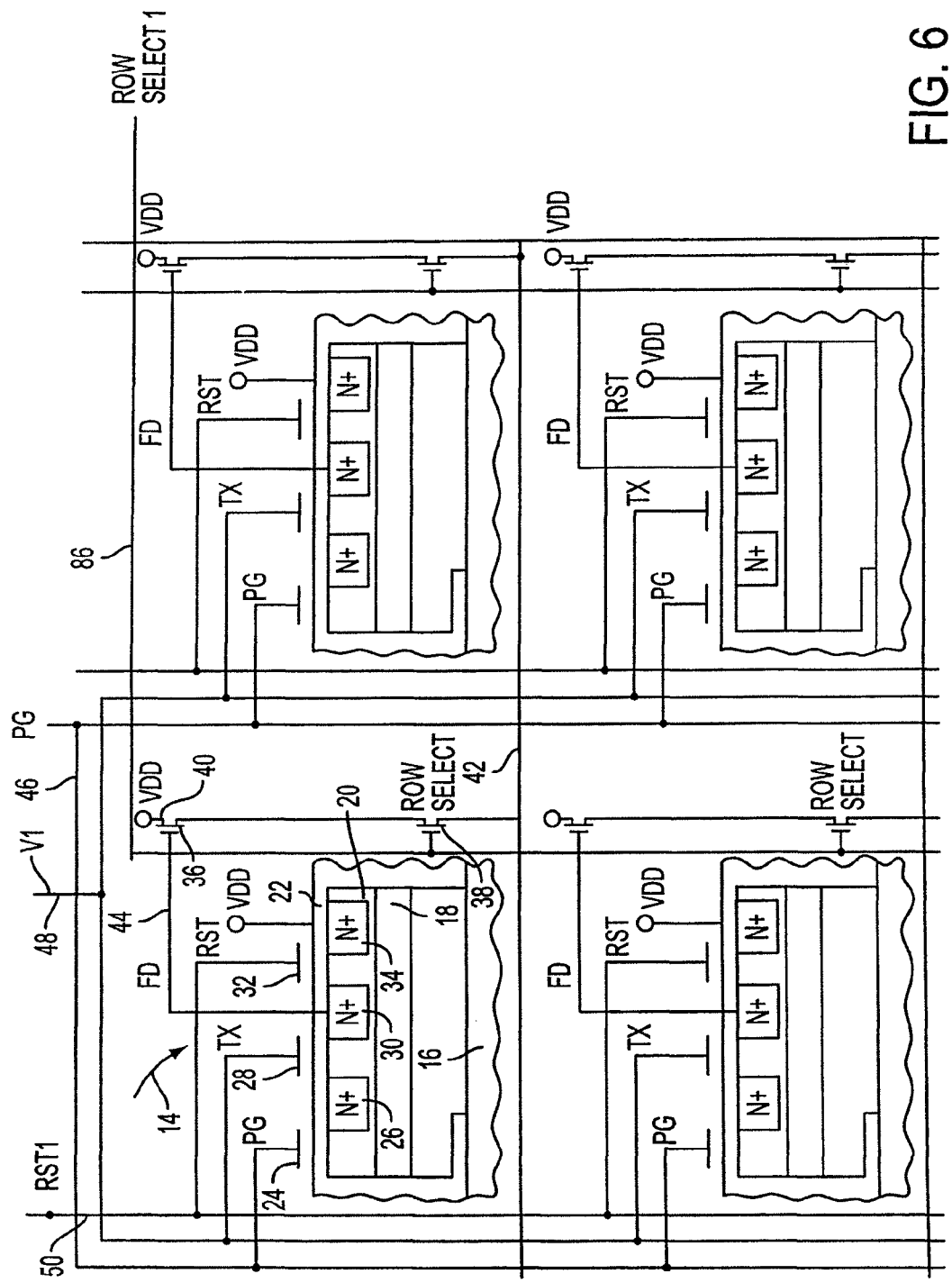
FIG. 6 is a representative CMOS pixel layout showing a 2×2 portion of an array.

In the conventional CMOS imager illustrated in FIGS. 4 and 6, doped regions 26 and 30 are both n+ type, or heavily doped. When electron charges are generated by photons transmitting through the photogate, the generated charges are attracted to and accumulate at region 26 until the transfer gate is activated to thereby transfer the accumulated charge to the floating diffusion node 30. In the conventional arrangement, however, the n+ doped region 26 has a tendency to retain photogenerated electrons even during the charge transfer process. The result is an incomplete charge transfer to the floating diffusion node 30, and loss of a portion of the light data obtained by the photogate.

A second aspect of the present invention addresses this problem, and is applicable in connection with imagers having 3T, 4T, 5T, 6T or 7T structure, such as the imager having a photogate, a transfer gate and a reset gate as described above with reference to FIGS. 4 and 6, and an imager having a photogate adjacent to a storage gate and a floating diffusion node adjacent to the storage gate, which structure has heretofore not been found in prior art CMOS imagers.

Figure 23:
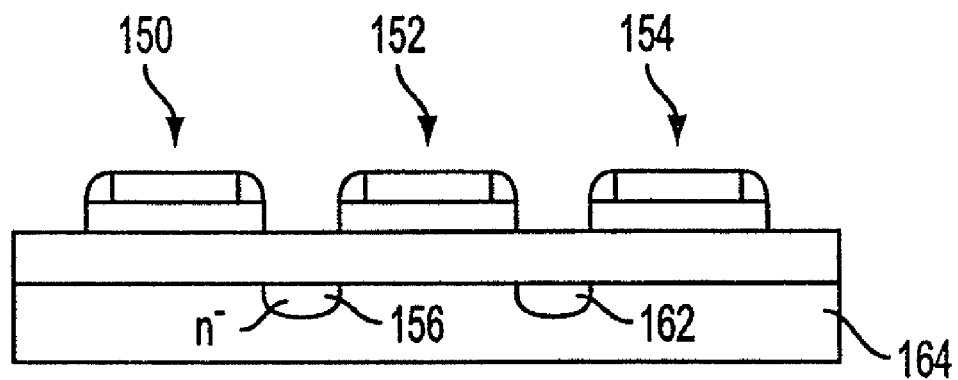
FIG. 23 illustrates a semiconductor device formed according to a second aspect of the present invention.

According to this aspect of the invention, gates 150, 152 and 154 are formed over a substrate 164, as shown in FIG. 23, according to prior art methods or according to the processes described above with reference to FIGS. 13-17 and 18-22. In this example, it is assumed that gates 150, 152 and 154 are to function as n-channel gates in the finished semiconductor device, as are photogate 24, transfer gate 28 and reset gate 32 in FIGS. 4 and 6. Instead of providing an n+ region between the gates 150 and 152 similar to region 26 in FIGS. 4 and 6, the present invention provides an n·doped, or lightly doped, region 156 between the gates 150 and 152.

An n– doped region has a lesser affinity for holding onto electrons than an n+ doped region, resulting in more complete charge transfer out of the n– doped region. Thus, although the region 162 between gates 152 and 154 may be n+ doped as in the prior art CMOS imagers, it is preferably also n– doped. Similarly, the region between any two adjacent transistor gates in a CMOS imager may be lightly doped according to the present invention, wherein such gates may include the photogate, the transfer gate, the reset gate, the source follower gate, the row select gate, and/or the storage gate.

This concept may also be implemented in a CCD imager by providing a lightly doped region between two transistor gates along the charge transfer path of a readout cycle. Preferably, a lightly doped region is formed between each pair of adjacent gates in the charge transfer path of a readout cycle.

The depth and concentration density of the dopant ions implanted into each region 156, 162 is determined by the implant range and diffusion in the substrate, which in turn is impacted by the temperature during the implantation process and the time duration at that temperature. Generally, however, an n+ doped region has a concentration of about $5 \cdot 10^{14}$ ions/$cm^2$ to about $1 \cdot 10^{16}$ ions/$cm^2$, with $1 \cdot 10^{15}$ ions/$cm^2$ to about $3 \cdot 10^{15}$ ions/$cm^2$ being typical. In the present invention, the n-doped region 156 has a concentration of about $3 \cdot 10^{11}$ ions/$cm^2$ to about $1 \cdot 10^{14}$ ions/$cm^2$, with $1 \cdot 10^{12}$ ions/$cm^2$ to about being $1 \cdot 10^{13}$ ions/$cm^2$ being preferred. For a doped region having a depth of about $1\mu$ ($10^{-4}$ cm) and using a concentration of $1 \cdot 10^{12}$ ions/$cm^2$, therefore, the n– doped region 156 has a concentration density of $\rho=(1\cdot 10^{12} \text{ ions}/cm^2)/(10^{-4} cm)=1\cdot 10^{16}$ ions/cu.cm.

Any suitable doping process may be used to form the n-doped region 156 and the n+ doped region 162. For example, the regions 156 and 162 may be formed by ion implantation, and may be performed in an ion implanter device by implanting appropriate n-type ions (e.g., arsenic, antimony, phosphorous, etc.) at an energy level of about 10 KeV to about 200 KeV into the substrate 164 to a depth of approximately 200-1000 Angstroms. A resist and mask may be used to shield areas of the substrate which are not to be doped. Since the gates 150 and 152 define the boundary along two sides of region 156, and the gates 152 and 154 define the boundary along two sides of region 162, the resist and mask need only define the boundaries of the regions to be doped along the sides not constrained by the gates. Optionally, the n– region 156 may be formed by blanket doping the exposed surfaces of the substrate.

It should be noted that in many transistors, the source and drain are essentially interchangeable, and interconnections specified herein should not be interpreted as solely limited to those described. In addition, while the transistors have been described as n-type or n-channel, it is recognized by those skilled in the art that a p-type or p-channel transistor may also be used if the structures are uniformly oppositely doped from that described. For example, gates 150, 152 and 154 in FIG. 23 may be p-channel gates instead of n-channel gates as described above, in which case region 156 (and optionally the region 162) are p-doped, or lightly doped p-type. The n and p designations are used in the common manner to designate donor and acceptor type impurities which promote electron and hole type carriers respectively as the majority carriers.

Figure 1:
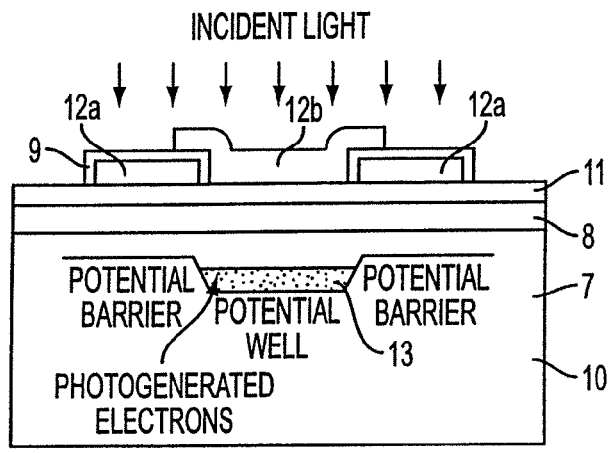
FIG. 1 is an illustration representative of a CCD imager pixel.
Figure 2:
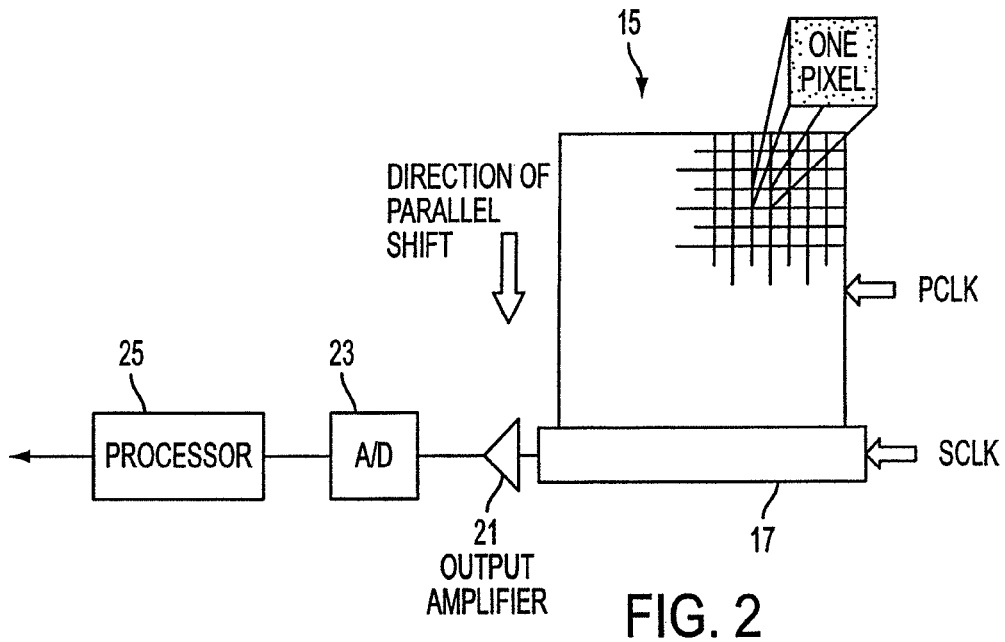
FIG. 2 is a block diagram of a CCD imager circuit.
Figure 3:
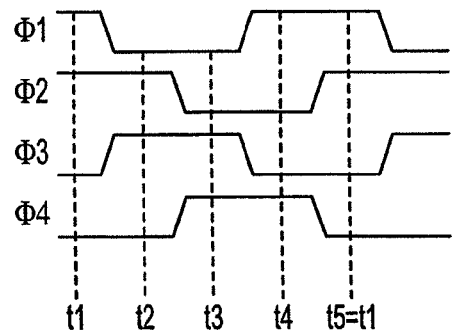
FIG. 3 is an exemplary timing diagram of a four-phase charge transfer through a pixel in a CCD imager.

Each pixel in the imaging array 15 of FIG. 2 may be constructed according to the first and/or second aspect of the invention. Similarly, each pixel in the array 90 of FIG. 5 may be constructed according to the first and/or second aspects of the invention. The operation of the imagers incorporating the present invention is the same as discussed hereinabove.

Figure 5:
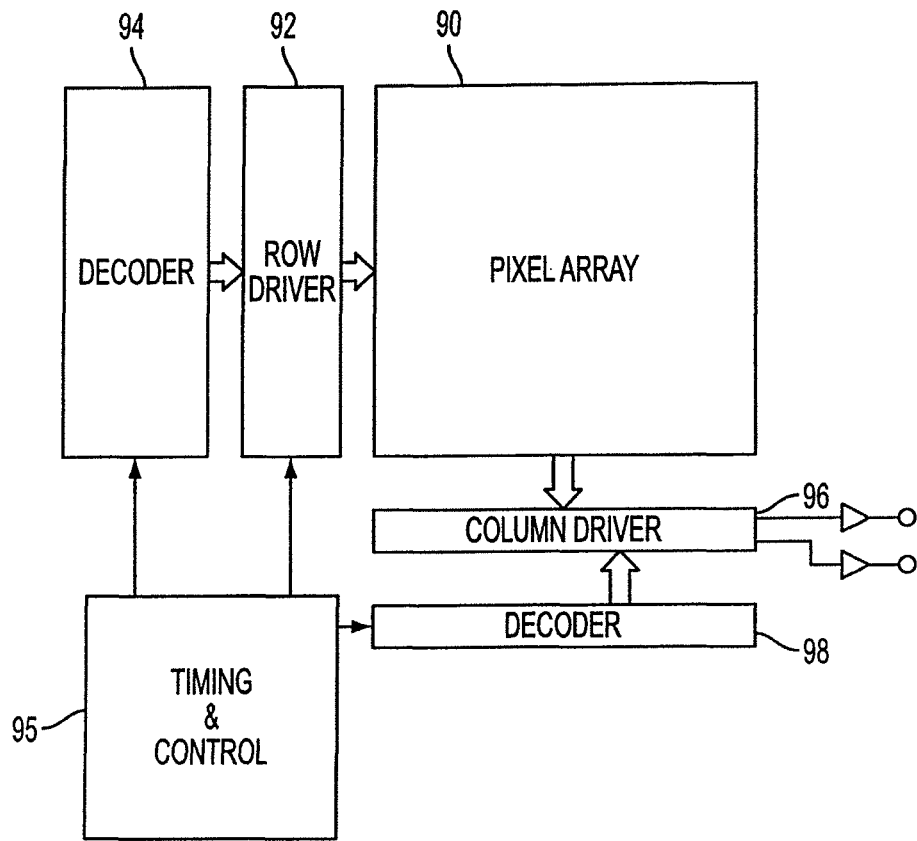
FIG. 5 is a block diagram of a CMOS imager circuit.
Figure 7:
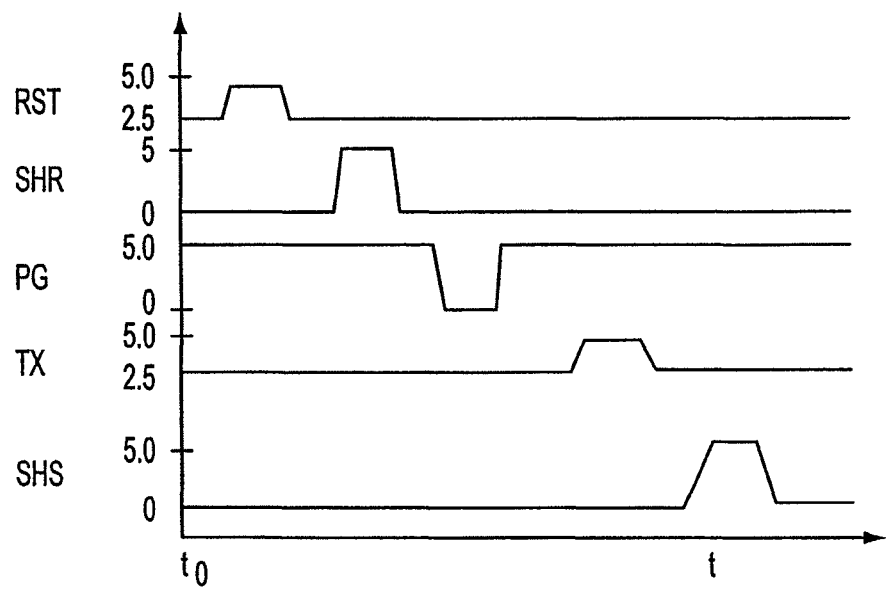
FIG. 7 is a representative timing diagram for the CMOS imager.

The imagers of FIGS. 2 and 5 having pixel structures fabricated according to the present invention can provide real-time or stored image output. A processor based system is exemplary of a system having digital circuits which could include semiconductor-based imager devices. A typical processor-based system, which includes a semiconductor-based imager 542 according to the present invention, is illustrated generally in FIG. 24. Without being limiting, such a system could include a computer system, camera system, scanner, machine vision system, vehicle navigation system, video telephone, surveillance system, auto focus system, star tracker system, motion detection system, image stabilization system, medical imaging devices, and data compression system for high-definition television, all of which can utilize the present invention.

Figure 24:
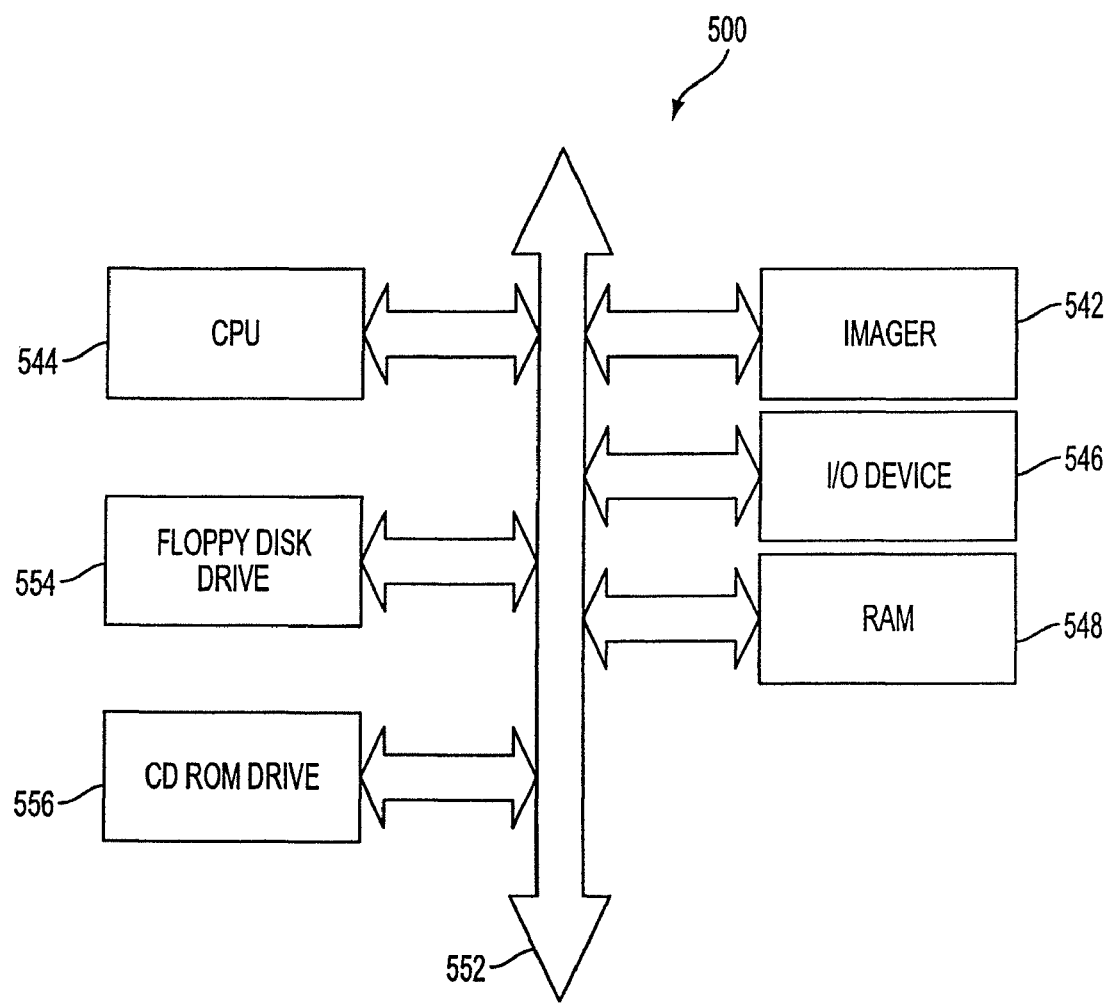
FIG. 24 illustrates a processor incorporating an imager fabricated according to the present invention.

FIG. 24 illustrates an exemplary processor system 500 which includes or operates in cooperation with the imager 542. The processor system 500, such as a computer system, for example, generally comprises a central processing unit (CPU) 544 that communicates with an input/output (I/O) device 546 over a bus 552. The imager 542 communicates with the system over bus 552 or a ported connection. The processor system 500 also includes random access memory (RAM) 548, and, in the case of a computer system, may include peripheral devices such as a floppy disk drive 554 and a compact disk (CD) ROM drive 556 which also communicate with CPU 544 over the bus 552.

The processing system 500 illustrated in FIG. 24 is only an exemplary processing system with which the invention may be used. While FIG. 24 illustrates a processing architecture especially suitable for a general purpose computer, such as a personal computer or a workstation, it should be recognized that well known modifications can be made to configure the processing system 500 to become more suitable for use in a variety of applications. For example, the imagers of the present invention may be incorporated into many different types of electronic devices including, but not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that comes within the spirit and scope of the following claims should be considered part of the present invention.

What is claimed as new and desired to be protected by Letters Patent of the United States is:

1. A method for fabricating a semiconductor device comprising:
    forming a conductive material over a substrate;
    forming a resist material on the conductive material;
    patterning the resist material, leaving a portion of the conductive material exposed through the patterned resist layer;
    partially etching the conductive material using the patterned resist material as a mask such that a plurality of first portions of the conductive material have a first thickness and a plurality of second portions of the conductive material have a second thickness that is greater than the first thickness, each second portion having a first width and being separated from each adjacent second portion by a first distance;
    removing the patterned resist material;
    forming spacers on sidewalls of the plurality of second portions and over the plurality of first portions;
    etching the exposed conductive material to substantially remove the exposed portions of the plurality of first portions of the conductive material;
    forming an insulating material on the plurality of second portions to form a plurality of gate structures; and
    doping a region between two adjacent gate structures.

2. The method of claim 1, wherein the first thickness is about half of the second thickness.

3. The method of claim 1, wherein doping the region between two adjacent gate structures is performed by implanting into the region a concentration of ions in the range of about $3\times10^{11}$ ions/cm$^2$ to about $1\times10^{14}$ ions/cm$^2$.

4. The method of claim 1, wherein doping the region between two adjacent gate structures is performed by implanting into the region a concentration of ions in the range of about $1\times10^{12}$ ions/cm$^2$ to about $1\times10^{13}$ ions/cm$^2$.

5. The method of claim 1, wherein doping the region between two adjacent gate structures is performed by implanting into the region a concentration of ions in the range of about $3\times10^{11}$ ions/cm$^2$ to about $1\times10^{14}$ ions/cm$^2$.

6. The method of claim 1, wherein doping the region between two adjacent gate structures is performed by implanting into the region ions in the range of about $1\times10^{12}$ ions/cm$^2$ to about $1\times10^{13}$ ions/cm$^2$.

7. The method of claim 1, wherein a distance between two adjacent gate structures is in the range of approximately 100 Angstroms to approximately 2000 Angstroms.

8. The method of claim 1, wherein a distance between two adjacent gate structures is in the range of approximately 300 Angstroms to approximately 1000 Angstroms.

9. The method of claim 1, wherein the conductive material is selected from the group consisting of: polysilicon, silicide, metal, polysilicon and silicide, and polysilicon and metal.

10. A method for fabricating a semiconductor device comprising:
    forming a conductive material over a substrate;
    partially etching a first portion of the conductive material such that the first portion of the conductive material has a first thickness and a second portion of the conductive material has a second thickness that is greater than the first thickness;
    forming a dielectric material to be located only on sidewalls of the second portion and over the first portion;
    etching the exposed conductive material to substantially remove the exposed portions of the first portion of the conductive material, wherein etching the exposed conductive material comprises reducing the second thickness of the second portion of the conductive material; and
    forming an insulating material on the plurality of second portions to form a gate structure.

11. The method of claim 10, wherein the first thickness is about half of the second thickness.

12. The method of claim 10, further comprising, prior to partially etching a first portion of the conductive material, forming a resist material on the conductive material and patterning the resist material to leave the first portion of the conductive material exposed through the patterned resist layer.

* * * * *